United States Patent [19]
Lawrence et al.

[11] 4,062,102
[45] Dec. 13, 1977

[54] PROCESS FOR MANUFACTURING A SOLAR CELL FROM A REJECT SEMICONDUCTOR WAFER

[75] Inventors: John E. Lawrence, Cupertino; Icheng Wu, Sunnyvale, both of Calif.

[73] Assignee: Silicon Material, Inc., Mountain View, Calif.

[21] Appl. No.: 645,791

[22] Filed: Dec. 31, 1975

[51] Int. Cl.² .............................................. B01J 17/00
[52] U.S. Cl. ........................................ 29/572; 29/575; 29/578; 136/89 C; 204/192 C; 427/91
[58] Field of Search ................... 29/572, 575, 576 B, 29/578, 580; 136/89; 148/188; 204/192 C, 192 S, 192 OF, 192 FR; 427/90, 91

[56] References Cited

U.S. PATENT DOCUMENTS

| | | | |
|---|---|---|---|
| 3,151,004 | 9/1964 | Glicksman | 29/576 B |
| 3,533,850 | 10/1970 | Tarneja | 29/572 |
| 3,600,797 | 8/1971 | Bower | 29/576 B |
| 3,617,373 | 11/1971 | Mott | 204/192 FR |
| 3,772,768 | 11/1973 | Fischer | 29/572 |
| 3,783,050 | 1/1974 | Nanba | 148/188 |
| 3,923,567 | 12/1975 | Lawrence | 29/575 |
| 3,985,597 | 10/1976 | Zielinski | 429/91 |

*Primary Examiner*—W. Tupman
*Attorney, Agent, or Firm*—Boone, Schatzel, Hamrick & Knudsen

[57] ABSTRACT

A process for manufacturing a solar cell from a reject semiconductor wafer comprising stripping all external layers from the wafer, etching the surfaces of the wafer so as to effectively remove all P/N junctions without pitting the wafer surface, introducing a layer of dopant to form a P/N junction in the front wafer surface, forming a first patterned conductive electrode over the dopant layer, and forming a second conductive electrode on the back surface of the wafer. In the preferred embodiment a sputtering operation is used to form the conductive electrodes.

14 Claims, 20 Drawing Figures

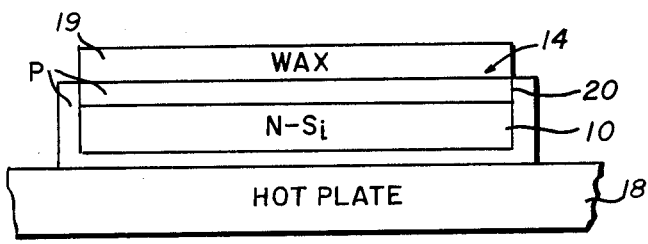
Fig_8
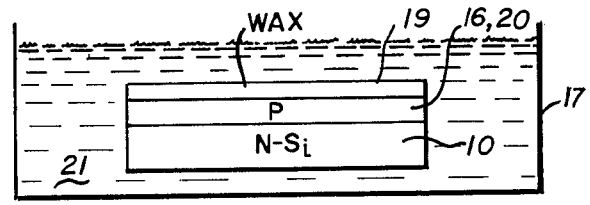
Fig_9
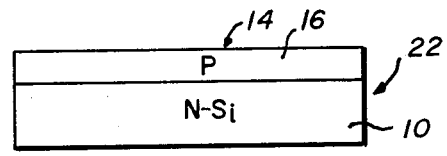
Fig_10
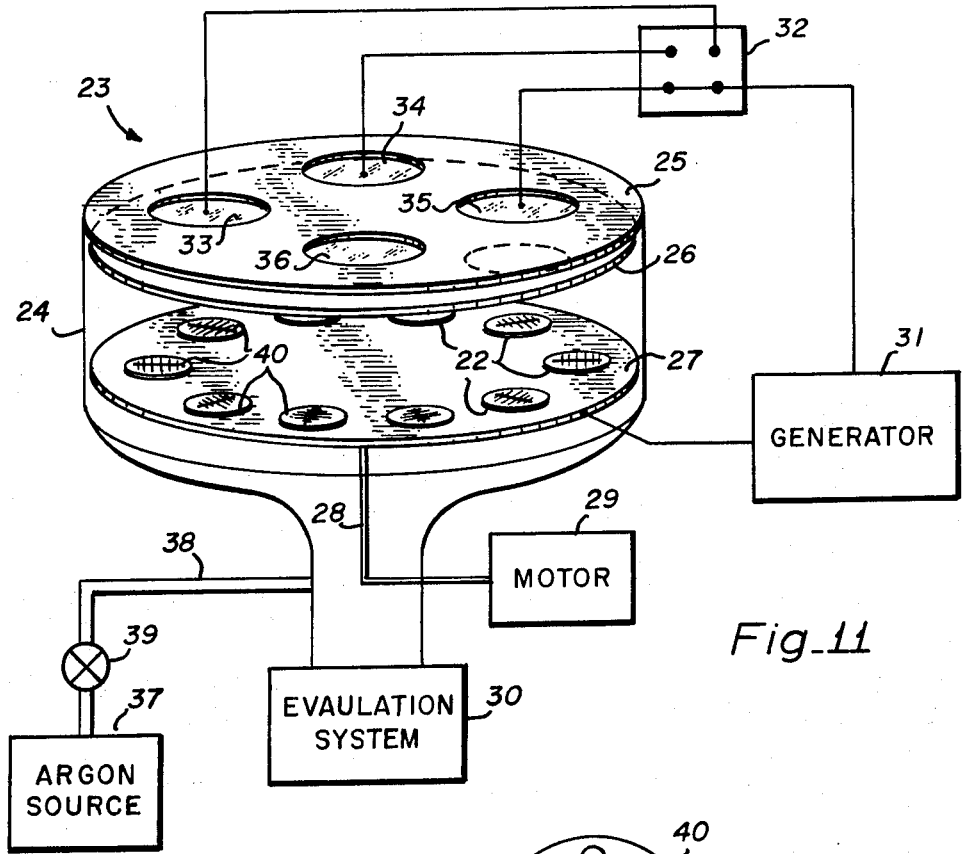
Fig_11
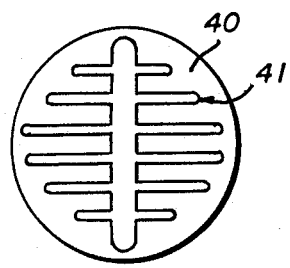
Fig_12

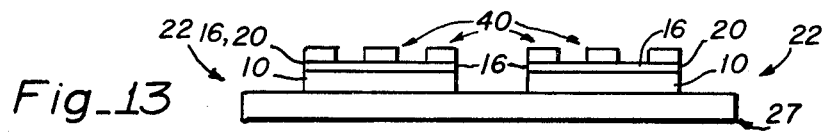
Fig_13
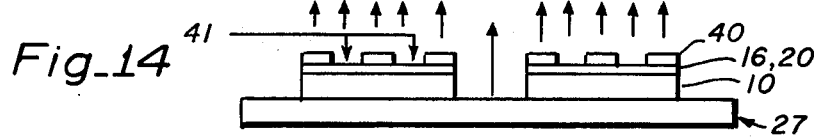
Fig_14
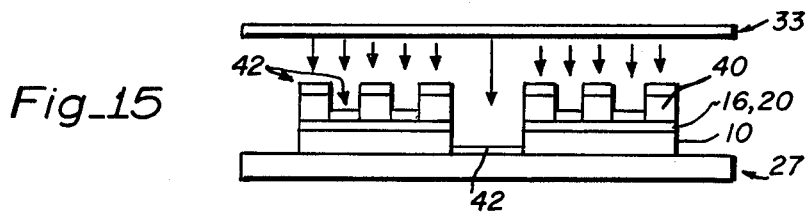
Fig_15
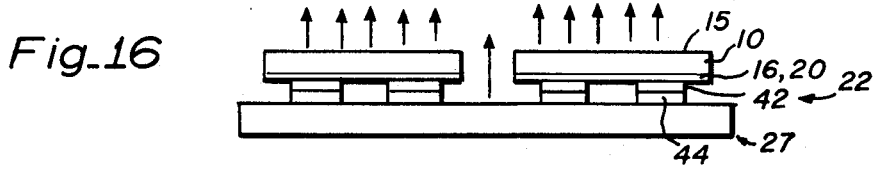
Fig_16
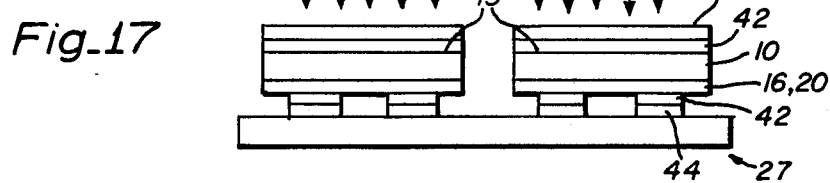
Fig_17
Fig_18
Fig_19
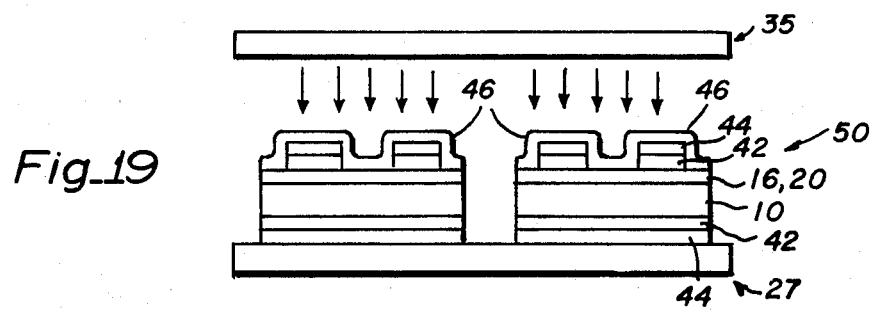
Fig_20
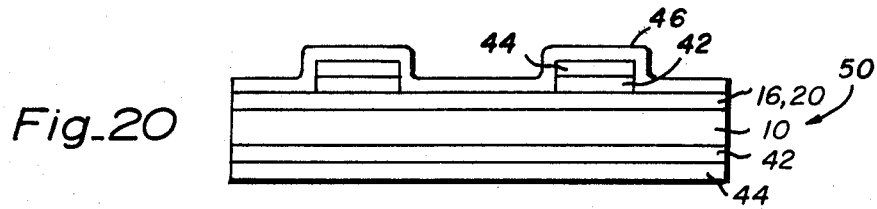

PROCESS FOR MANUFACTURING A SOLAR CELL FROM A REJECT SEMICONDUCTOR WAFER

BACKGROUND OF THE INVENTION

1. Field of the Invention

The present invention relates generally to a process for manufacturing a solar cell, and more particularly to a process for manufacturing a solar cell from a reject semiconductor wafer.

2. Description of the Prior Art

Photovoltaic cells, or solar cells as they are commonly known, have been available for many years and presently are used to annually provide 100 kilowatts (KW) of energy in the United States. However, the current market price of such cell is about $25,000.00 per kilowatt capacity, an amount which is so prohibitive that it excludes such cells from consideration as a wide spread source of residential and commercial electric power.

The cost of a starting single crystal silicon wafer is more than one half the total manufacturing cost of a finished solar cell. For example, the cost of a new 3 inch wafer is six dollars whereas the cost of a finished solar cell is about nine dollars. Hence, less expensive sources of single crystal silicon wafers must be developed. The new inexpensive silicon wafers will likely require new solar cell product fabrication techniques to minimize yield loss due to the unique features of the inexpensive starting material.

Conventional solar cells are typically fabricated on new silicon wafers which were ordered to have a specific conductivity type, dopant concentration, orientation, thickness, and diameter. New silicon wafers not satisfying the specified description are not desirable for use in fabricating conventional solar cells due to a lack of compatibility between the fabrication process and the starting wafer that would contribute to low line yield or poor product performance.

In fabricating a conventional solar cell a dopant impurity is first introduced into the front surface of the water to form a shallow P/N junction. The front and back surfaces of the wafer are then coated with a highly conductive metallic layer. Metal deposition is usually accomplished in a planetary support system in which the wafers are place above the source metal. This metal deposition technique is commonly used in the semiconductor industry because of its rapid throughput. The usual restricted use of whole wafers, thick wafers, and wafers of similar diameters facilitates the use of this method of depositing metal. The final step in the conventional solar cell fabrication procedure consists of etching a pattern in the metal layer covering the front wafer surface. This final step is accomplished through the use of the photolithographic process commonly used in the semiconductor industry of photoresist spinning, baking, image exposing, photoresist developing, metal etching and photoresist stripping. A disadvantage of this process is that it is costly and prone to low yields when used to build solar cells from nonstandard starting wafers.

In view of the high cost of conventional solar cells, the Energy Research and Development Administration (ERDA) of the United States Government has recently identified the requirement of a low cost source of silicon and a solar cell fabrication procedure compatible to such low cost silicon as an area worthy of major attention.

SUMMARY OF THE PRESENT INVENTION

Presently, rejected semiconductor wafers constitute the lowest cost source of single crystal silicon wafers available. Such reject wafers have definite value as future starting material for the fabrication of solar cells (photovoltaic products).

It is therefore a primary object of the present invention to provide a process for manufacturing a solar cell from a reject semiconductor wafer.

Another object of the present invention is to provide a process for transforming a reject semiconductor wafer into a starting silicon wafer suitable for solar cell fabrication at a greatly reduced cost as compared to a conventional starting silicon wafer.

Still another object of the present invention is to provide a simple inexpensive process for fabricating solar cells which is compatible to the unique features of rejected semiconductor wafers used as the starting material.

Yet another object of the present invention is to provide a method of chemically etching a silicon wafer surface which contains localized P/N junctions such that the resulting silicon surface is flat enough to be used directly for the fabrication of solar cells without further polishing.

Still another object of the present invention is to provide a low cost, high yield process for directly depositing a metal pattern on wafers which may be very thin, broken, or of randomly different diameters.

Another object of the present invention is to use a metal deposition system which will waste only small amounts of the metal and provide for a very low silicon-metal interface contact resistance.

Briefly, the preferred embodiment of the present invention includes the steps of stripping all external conducting and insulating layers from a reject semiconductor silicon wafer, etching the surfaces of the wafer so as to effectively remove all P/N junctions previously formed within the reject wafer without severely roughening the wafer surface, forming a new P/N junction in the front wafer surface, directly forming a patterned first conductive electrode on a sputter cleaned front wafer surface, and forming a second conductive electrode on a sputter cleaned back wafer surface.

An advantage of the present invention is that it is simple and can be used to manufacture an equivalent solar cell at about one-third of the present manufacturing costs.

Another advantage of the present invention is that it reduces the cost of a solar cell's starting silicon wafer to 10% the cost of a conventional starting wafer.

Still another advantage of the present invention is that it produces solar cells from broken wafers, thin wafers, and wafers of differing diameters at no additional cost, yield loss, or loss in performance efficiency.

Another advantage of the present invention is that it includes a chemical etching step that enables silicon surfaces with localized P/N junctions to be dissolved without creating silicon surface roughness which degrades solar cell performance.

Yet another advantage of the present invention is that it incorporates a sputter operation that cleans the silicon surface in vacuum just prior to metal deposition, for reducing metal-silicon contact resistance, that directly produces a metal pattern on the front surface of the wafer, and that wastes very little metal.

These and other objects and advantages of the present invention will no doubt become apparent following a reading of the detailed description of the preferred embodiments which are illustrated in the several figures of the drawing.

IN THE DRAWING

FIG. 8 is a view similar to FIG. 7 that illustrates a wax masking technique that is utilized in an alternative embodiment of the present invention.

FIG. 9 is a view similar to FIG. 8 as the wafer with the wax on the front surface is immersed in a silicon etching solution to remove the P/N junction from the back and edge surfaces;

FIG. 10 is a view silimar to FIG. 9 after the wax has been removed from the front surface and the layer including the dopant has removed from the back surface of the structure;

FIG. 11 is a diagrammatic perspective view of a sputtering chamber including a platform carrying a plurality of wafer structures of the type shown in FIG. 10;

FIG. 12 is a plan view of a metal mask;

FIG. 13 is a diagrammatic view of two wafers resting on the sputter chamber platform with a metal mask laying on top of the front wafer surfaces;

FIG. 14 is a view similar to FIG. 13 during an RF sputter cleaning operation;

FIG. 15 is a view similar to FIG. 14 as metal is being sputtered on the metal mask and through its slots to directly form a metal pattern on the front wafer surface of the wafers;

FIG. 16 is a view similar to FIG. 14 as the back surfaces of the wafers are sputter cleaned;

FIG. 17 is a view similar to FIG. 16 as the wafer's back surfaces are being covered by sputtered metal;

FIG. 18 is a side elevation view of a solar cell;

FIG. 19 is a side elevation view illustrating the application of an anti-reflective coating over the front surface of the solar cell; and FIG. 20 is a side elevation view illustrating a solar cell with an anti-reflective coating.

DETAILED DESCRIPTION OF THE PREFERRED EMBODIMENT

Figure 1:
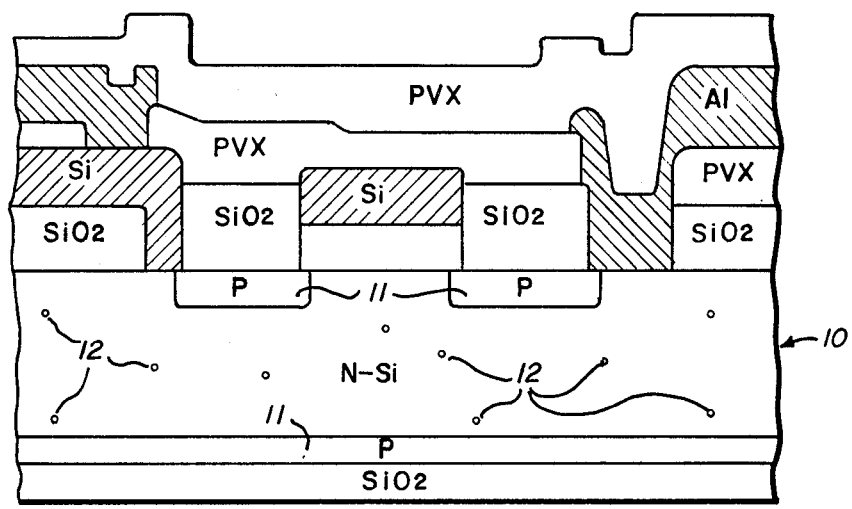
FIG. 1 is an elevational cross-sectional view of a semiconductor wafer including several external conducting and insulating layers as the wafer may be received prior to being processed in accordance with the present invention.

Rejected semiconductor wafers which are to be transformed into solar cells may have a complex structure as shown in FIG. 1. The bulk silicon wafer 10 has the dopant type, resistivity, and orientation of the original as-grown crystal. The wafer 10 having an N-type conductivity with P-type diffusion regions 11 forming P/N junctions may have epitaxial layers (not shown), and external layers such as silicon dioxide ($SiO_2$), phosphovapox ($Si_3N_4$), silicon nitride (not shown), phosphosilicate glass (PSG not shown), aluminum, (Al), and poly-silicon. Although a complex metal-oxide-semiconductor (MOS) structure is illustrated, it should be recognized that all reject wafers, even those which were rejected after an initial oxidation step and also bipolar structures may be processed in accordance with the present invention.

Figure 2:
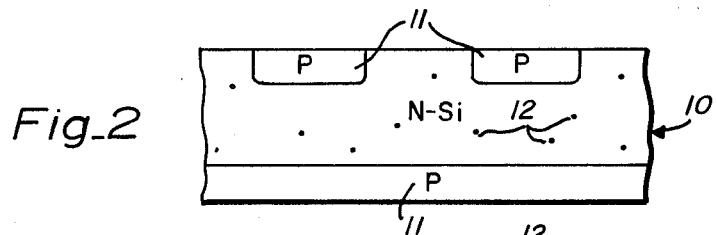
FIG. 2 is a view similar to FIG. 1 after the external layers have been stripped from the silicon wafer.

The intial required step, i.e. stripping, of the process for transforming a reject semiconductor wafer into a solar cell consists of removing all conducting and insulating material external to the silicon wafer. The as-received semiconductor reject wafers are loaded into acid-resistant carriers, and then immersed in different acids; such as $H_2SO_4:H_2O_2$ to remove photoresist; HF to remove $SiO_2$, $Si_3N_4$, PVX and PSG; $HCl:HNO_3$ to remove metals; and $HF:HNO_3:HAC$ to remove poly-silicon which may be external to the silicon wafer 10. Other materials external to the wafer 10 may require different solutions to achieve complete removal. FIG. 2 illustrates a rejected semiconductor wafer with all external layers removed as a result of this required processing step.

Figure 3:
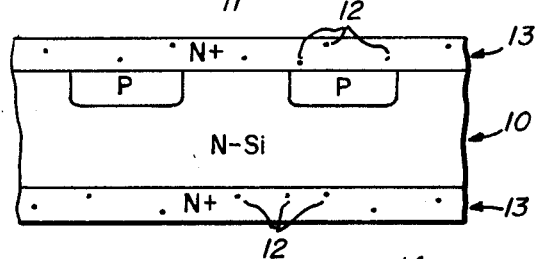
FIG. 3 is a view similar to FIG. 2 after a gettering step in which phosphorus is diffused into the wafer.

Within the stripped wafer, as illustrated in FIG. 2, many contaminants 12 are embedded. Common contaminants may include oxygen, carbon, and metals, such as copper. Should it be desired to remove most of the contaminates 12, a gettering step may be used. In the gettering step, a furnace boat containing the stripped wafers is placed on a conveyor and slowly moved into a furnace having a temperature in the range between 970° C and 1150° C. When the temperature of the wafers is approximately that of the furnace, a phosphorus impurity is carried in a gas stream to the wafers whereupon the phosphorus is diffused into the surfaces of the wafers. The source of the phosphorus is functionally infinite throughout the furnace cycle and is perferably $P_2O_5$, although $POCl_3$ and other gaseous sources of phosphorus may also be used. The phosphorus is diffused from the infinite source to a depth of about two microns into the semiconductor wafer. This generally takes 20 to 40 minutes depending on the furnace temperature. After the predetermined period, the wafers are withdrawn and the diffusant source is removed. Then the wafers are transferred into a cool zone and allowed to cool to a temperature suitable for handling. With reference to FIG. 3, the diffused phosphorus as illustrated by the numeral 13. At the completion of this furnace gettering step, the wafers are immersed in HF to remove the phosphorus glass.

A key to the successful application of this furnace gettering steps is to generate the greatest possible surface lattice damage as a result of the phosphorus diffusion. Phosphorus atoms are smaller than the silicon substitutional lattice site they occupy, thus high concentrations of diffused phosphorus will generate more crystal strain, i.e., lattice damage. Highly mobile contaminant impurities are drawn into the silicon surface lattice damage by the Cottrell getter mechanism.

Figure 4:
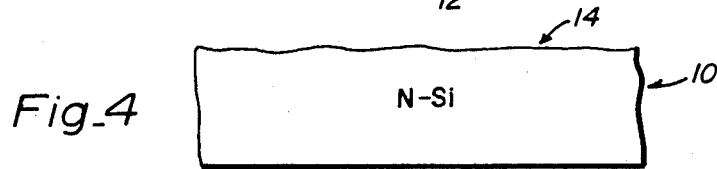
FIG. 4 is a view similar to FIG. 3 after the wafer has been silicon etched to remove the P/N junctions and the phosphorus getter region.

Next, with reference to FIG. 4 the semiconductor wafer is silicon etched to chemically dissolve the silicon lattice which contains dopant atoms introduced after crystal growth, while leaving the remaining silicon surfaces relatively flat. (See FIG. 4 where numerals 14 and 15 identify the front and back wafer surfaces, respectively.) In this step, the silicon wafers are loaded into a carrier which holds the wafers apart while they are immersed in a silicon etching solution. Perferably, the etchant comprises hydrofluoric acid, nitric acid, acetic acid and iodine in accordance with the following formula: 1 HF : 3HNO$_3$:4HAC (Acetic Acid) : I$_2$ (saturated). This etchant provides an etching rate near 12 microns per minute per side at 25° C. While the wafer carrier is immersed in the etchant, continuous agitation of either the carrier or the container should be used. The desired nonpreferential etch and nonstaining features of this chemical polishing step are enhanced by having the freshest available solution in contact with the silicon wafer at all time.

After removing 12 microns of silicon from each outer surface from about 100 silicon wafers having a 3-inch diameter, it has been found that the above-identified etchant tends to heat up and subsequently would cause a preferential etching of additional wafers immersed therein. Such an occurrence is undesirable since preferential etching introduces excessive topographical roughness to the wafer surfaces. Thus when using one liter quantities, the etchant is changed after 100 wafers have been immersed therein.

Alternatively, other etching solutions that remove silicon at a constant rate regardless of the impurity type, impurity concentration, crystalline orientation, and lattice strain, as well as to retard the formation of strains and preferential etching may be used.

Typically the diffusion depth of the P/N junctions is known from the history of the reject silicon wafer. Generally, it is about 3 microns on PMOS wafers and 25 microns on LIC wafers. Consequently, the time required to remove the silicon varies in accordance with such a depth. In the preferred embodiment, in order to insure that all traces of the P/N junctions are removed, the wafer is immersed in the etchant for a time sufficient to remove about 0.5 mils of material more than the depth of the P/N junctions that have been diffused into the wafer.

It should be apparent that after the removal of the outer regions of the silicon wafer the resultant wafer is relatively thin compared to a virgin wafer, and in many cases may be broken.

Figure 5:
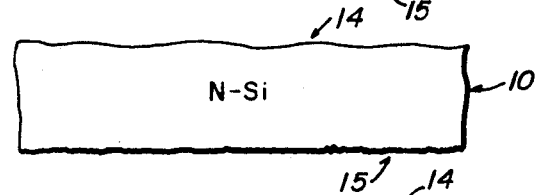
FIG. 5 is a view similar to FIG. 4 after the wafer back surface has been mechanically ground to introduce a controlled amount of lattice damage.

In an alternative embodiment a back grinding step follows the silicon etch. In this step the silicon wafer front surface 14 is placed on a vacuum chuck. The wafer is then rotated and an abrasive material is drawn across the back surface 15, thus introducing a controlled amount and distribution of back wafer surface lattice damage. The wafer's back surface is continually cooled and lubricated by running deionized water preceding, during and following the abrading. FIG. 5 illustrates a wafer with back surface wafer lattice damage. Alternatively, the lattice damage on the back surface may be accomplished by lapping, ion implantation, or bombarding the surface with hard material.

The key to the successful application of this process is to generate a large amount of lattice damage in a controlled way such that the newly formed lattice damage does not propagate through the wafer during the subsequent furnace treatments which will be used to form the solar cell's P/N junction. The large amount of lattice damage on the back wafer surface is important for such damage will attract, and thus electrically neutralize, all highly mobile contaminants in the wafer during the subsequent furnace treatment used to form the solar cell's P/N junction. It has been found that solar cells in which this process step is employed tend to develop a longer minority carrier lift time and have a lower P/N junction leakage current, and hence exhibit an increased efficiency.

Figure 6:
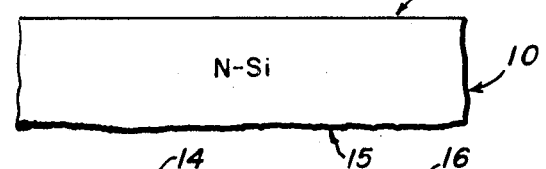
FIG. 6 is a view similar to FIG. 5 after the wafer front surface has been polished to a mirror-like finish.

Referring now to FIG. 6, in another alternative embodiment the front surface 14 of the silicon wafer 10 is polished to a mirror-like finish. Such a finish is achieved by the conventional chemical-mechanical polishing procedure given new silicon wafers. In this step silicon wafers are mounted on a plate using a wax like glycolthylate. The plate is mounted on a polishing machine. The plates are pressed against a polishing cloth while the cloth and the plates are rotated counter to each other to produce a polishing action. A slurry is added to the cloth/wafer interface while the polishing action takes place. Preferably, the slurry is colloidal silica in which the Ph is increased by the addition of sodium hydroxides. Approximately ten to twenty microns of silicon are removed by this front wafer surface polishing process. After the silicon surface is polished to a mirror-like finish the slurry is replaced by deionized water in a rinsing action. The wafers are then demounted and the wax is removed from the wafer back surface 15 by immersing the wafers in trichloroethylene, then acetone, then deionized water.

Figure 7:
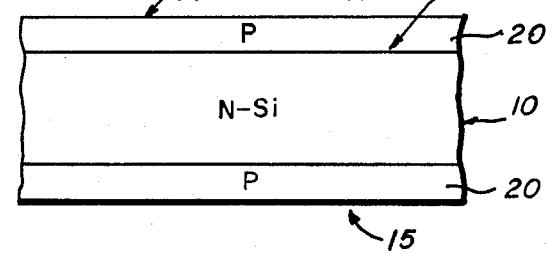
FIG. 7 is a view similar to FIG. 6 after a dopant has been introduced to form the P/N junction at the front surface required by the solar cell.

Next it is required to diffuse a dopant layer 20 into the front surface 14 to form a P/N junction 16 as shown in FIG. 7. For N-type silicon wafers 10, the P/N junction 16 is formed by the diffusion of boron. This is commonly achieved by placing fifty to three hundred wafers on a furnace boat. The boat is then inserted to a furnace of temperature between 1000° C and 1200° C. Boron then passes from a BCl$_3$, BBr$_3$, diborane, or boron nitride source to the wafer. The furnace cycle times and ambients are set to provide the silicon wafer with a P/N junction having a depth of about three-tenths of a micron (3000A°) beneath the silicon wafer surface and with a boron diffused region having a sheet resistivity of 60±30 ohms per square. The furnace doping process so described will diffuse boron into all surfaces of the wafer, i.e., front, edge, and back. Solar cells require the P/N junction only on the front wafer surface 14. The back wafer surface 15 should be free of P/N junctions such that metal electrodes placed on the front and back wafer surfaces, in a later processing step, will be electrically isolated. However, as shown the boron 20 is also diffused into the back wafer surface 15. A wafer mesa etching technique for selectively removing the P/N junction from the wafer edge and back surface is described in a later processing step.

In an alternative embodiment, the P/N junction is formed by ion implantation. Accordingly, only the front surface 14 facing the ion source is doped with the boron. Hence, the subsequent removal of the P/N junction from the edge and back surface, as will be subsequently described, is not required.

After the front surface 14 has been bombarded with the ions an annealing step is required. During annealing, the wafer is placed in a furnace filled with nitrogen and having a temperature between 900° C and 950° C for a period of about 15 to 30 minutes. This allows the boron dopant to stabilize within the silicon lattice and also serves to cure radiation damage caused by the bombardment of the silicon lattice.

In yet another alternative embodiment, the boron dopant may be spun on to the front surface 14 and then the wafer is heated to about 1000° C in the diffusion furnace. In such a manner the dopant is restricted to the front surface of the wafer. Accordingly, as in the ion implantation step, the subsequent removal of the back surface is not required.

Still another alternative embodiment begins with a P-type starting wafer 10. Accordingly, the P/N junction is formed by the diffusion of implantation of an N-type dopant such as phosphorus of antimony. Such N-type dopants are introduced by furnace sources, ion implantation, or spun on just like the boron described above. The solar cells P/N junction 16 must be localized to the front wafer surface 14.

All silicon wafers with newly formed P/N junctions, regardless of the dopant source should be immersed in hydroflouric acid to remove the dopant glass phase from the wafer surfaces. Such a treatment is not identified in a figure drawing.

The following step, i.e., mesa etch, is an alternative embodiment since it is not required if by the preceding steps the wafer's P/N junction is localized to the front wafer surface. In this step the back surface 15 of a doped silicon wafer is placed onto a hot plate as shown in FIG. 8. The wafer is then heated to about 100° C to 150° C. Next an acid-resistant wax, such as apiezon wax, 19 is placed on the top surface of the boron layer 20 of the wafer 10. The wax 19 has a melting temperature between 100° C and 150° C and thus is caused to melt in a covering relationship over the top surface without covering the side surfaces of or the back surface of the wafer. In alternative embodiments, carnuba wax or beeswax may be used. The structure is removed from the hot plate 18, cooled to room temperature and then immersed in a container 17 filled with a silicon etching solution 21, similar to that previously described which serves to remove the P/N junction from the portions of the wafer that are not covered by the wax 19. Such an assembly is shown in FIG. 9. Next, the wafer with its wax mask is quenched in water to stop the reaction of the solution 21, dried and thereafter immersed in trichloroethylene (TCE) solution to dissolve the apiezon wax 19. Afterwards, the wafer may be immersed in acetone, followed by deionized water. The P/N body 22 shown in FIG. 10 is the result of the processing steps applied thus far.

As was previously explained, the preceding steps illustrated in FIGS. 8-10 and commonly referred to as the "mesa/back surface etch" are not required if the P/N junction dopant is introduced by ion implantation or by spin-on techniques. Since those techniques do not cause the boron layer to be formed on the side surfaces or the back surface of the wafers.

Alternatively, the P/N junction may be removed from the back surface by lapping, grinding, or bombarding the back surface with a hard material. However, if the alternative techniques are used, care must be taken not to damage the P/N junction on the front surface.

Referring now to FIGS. 11-17, a sputtering operation is carried out to selectively deposit conductive electrodes on the front and back surfaces of the body. The sputtering apparatus 23 with a plurality of wafer bodies 22 is shown in FIG. 11. The sputtering apparatus 23 includes a vacuum chamber 24, a cathode electrode 25, a shutter 26, an anode electrode, or platform 27 mounted to a shaft 28, a motor 29 for rotatably driving the shaft 28, an evacuation system 30 for evacuating the chamber 24, an electrical energizing system 31 for applying radio frequency (RF) and D.C. energy to the anode and cathode electrodes, a switch 32 for selectively connecting the system 31 to target portions 33-36 of the cathode 25, an argon source 37, conduit 38 for connecting the argon source 37 to the vacuum chamber 24 and a pressure regulator 39 for controlling the pressure of the argon introduced to the chamber 24. The electrical energizing system 31 includes an RF generator, an RF impedance matching network and a DC power supply. In the preferred embodiment, the sputtering apparatus is one manufactured by Perkin Elmer Ultek and designated by them as the Model 2400-8SA. The target 33 is titanium, the target 34 is silver, and the target 36 is silicon monoxide. Since such an apparatus is commercially available the details of the construction and operation of the apparatus are not described herein.

A sputter mask processing step is then utilized to affect direct printing of the front electrode pattern on the body 22. The objective of this step is to position the bodies and their masks 40 such that direct metal electrode pattern formation can occur during subsequent steps. In this step the silicon bodies or wafers 22 shown in FIG. 10 are placed onto the sputter apparatus platform 27 such that the front surface of the wafer 22 is facing upward. The metal mask 40, such as shown in FIG. 12, is placed over the wafer 22.

The mask 40 consists of a sheet of metal with an etched pattern of slots 41. The etched pattern 41 will allow for the restricted passage of metal through the slots during a subsequent step of metal deposition, for direct metal pattern formation. In the preferred embodiment the mask 40 is formed from full-hard stainless steel having a thickness of about 8 mils and having extremely flat outer surfaces. The assembly of the mask 40, wafer 22, and platform 27 is shown in FIG. 13.

Following the masking step, a front metallization step is required to clean and then deposit a metal pattern on the wafer's front surface. This step is illustrated in FIGS. 14 and 15 and utilizes the vacuum system 30 to draw a pressure of $10^{-6}$ torr in the sputter chamber 24. (Vacuum pressures in the range of $10^{-5}$ to $10^{-7}$ torr may be utilized.) After the desired vacuum pressure is drawn, argon 37 is then released to the chamber 24 such that a pressure near $2 \times 10^{-2}$ torr is obtained and controlled by the regulator 39. Next, the power generator 31 is energized to apply an electrically reverse RF power flow between the cathode 25 and the anode 27. In this manner the surface of the wafer exposed though the slots 41 in the mask 40 is bombarded with ions. This action removes small amounts of silicon surface contamination (as indicated by the arrows in FIG. 14) which would otherwise increase silicon-metal contact resistance.

After the sputter cleaning action is completed, the cathode target 33 comprised of a first metal to be deposited on the wafers is energized. Initial deposition occurs onto the shutter 26 to minimize the possibility of transferring cathode target surface contamination onto the silicon wafers. After this initial deposition, the shutter 26 is rotated to a position that allows the cathode target material to be transferred as a metal layer 42 onto the assembly comprising the silicon wafers 22, the metal masks 40, and the platform 27. This activity is illustrated in FIG. 15. The initial metal that comprises the target 33 and is deposited as layer 42 is titanium. After the deposition of 1500 A° of titanium the source is de-energized, and the second metal cathode target 34 is energized. In a manner similar to that previously described, the cathode surface contamination is deposited on the shutter and the shutter is rotated to allow a second metal layer 44 to be deposited on the first metal layer 42 that covers the wafers 22, the metal mask 40, and the platform 27. The second metal that comprises the target 34 and in deposited as layer 42 is silver. After the deposition of 50,000 A° of silver on the first metal layer 42 the source is de-energized. The deposition of the front metal electrode on the solar cell is thus completed and the chamber 24 is allowed to return to atmospheric pressure. The metal masks 40 are lifted from the silicon wafers 22.

The next required processing step, i.e., back metallization, is illustrated in FIGS. 16–17. In this step the wafers 10 are turned over such that the silver layer 44 rests on the platform 27. Accordingly, the back surface 15 now faces upward toward the shutter 26 and the associated targets of the sputter apparatus 23. The sputter chamber 24 is closed, a vacuum is drawn and a sequence of actions similar to those described in the front metallization processing step is followed. However, in this step no metal mask is used to selectively cover the back wafer surface 15. FIG. 16 illustrates the cleaning action of the back surface and is similar to that shown in FIG. 14. FIG. 17 illustrates the deposition action (similar to that shown in FIG. 15) by which two metal layers 42 and 44 are deposited on the back surface 15. As before, upon the completion of second metal deposition the sputter chamber 24 is allowed to raise to atmospheric pressure. With the described process a solar cell 50 as shown in FIG. 18 has been formed. The solar cell 50 includes the silicon wafer 10 having a front surface P/N junction 16, a titanium layer 42 and a silver layer 44.

Relative to the metal layers it has been found that the layers described above, i.e., 1500 A° titanium covered by 50,000 A° silver, provide the resulting solar cell with very favorable high conductivity electrodes. However, it should be recognized that the metal layer thicknesses can vary and the types of metal can be changed, to provide similarly favorable results in solar cell product performance.

In fabricating the solar cell various alternatives are possible. For example, a sintering step can be used to reduce silicon-metal contact resistance and thus increase solar cell performance efficiency. In the sintering step the solar cell wafers are loaded on a furnace boat. The boat is then inserted into a furnace having a temperature of about 500° C (for titanium silver metalization layers) and a nitrogen or nitrogen-hydrogen mixture of gasses as the furnace ambient. The wafers are left in the furnace for a period of approximately fifteen minutes. After this period, the wafers are withdrawn from the furnace and allowed to cool to room temperature.

Referring to FIG. 19 another process step is illustrated which may be used to form an antireflective coating on the solar cell of FIG. 18. Such a coating can increase the performance efficiency of a solar cell by twenty percent. In this step the solar cell 50 is placed on the sputter chamber platform 27 of the sputter apparatus 23 with its front surface facing up. The chamber 24 is then sealed and a vacuum of $10^{-6}$ torr is drawn. The silicon monoxide source cathode 35 is then energized and the cathode's surface contaminants are deposited on the shutter. After this discharge of the contaminants the shutter is rotated to a position that allows for the deposition of a layer 46 of silicon monoxide onto the entire front surface of the solar cell. The silicon monoxide cathode 35 is de-energized after about 700 A° of silicon monoxide is deposited on the front surface. The sputter chamber pressure is then allowed to raise to the atmospheric level and the chamber is opened. The finished solar cell wafers with an antireflective silicon monoxide coating 46 provided is shown in FIG. 20.

From the above, it has been found that the described sputtering techniques can be used to form electrodes on wafers of all sizes and shapes since the wafers are laid flat on the table. In addition, since the masks are in direct contact with the layer 20, subsequent etching steps to remove unwanted metal are not required.

As described herein many alternative process steps are disclosed. Several of these steps are employed when it is desired to produce a solar cell having increased efficiency at a consequently higher manufacturing cost.

While the invention has been particularly shown and described with reference to certain preferred embodiments, it will be understood by those skilled in the art that various alterations and modifications in form and detail may be made therein. Accordingly, it is intended that the following claims cover all such alterations and modifications as fall within the true spirit and scope of the invention.

What is claimed is:

1. A process for manufacturing a solar cell from a reject semiconductor wafer containing process induced contaminants in the silicon bulk latice, comprising:
   stripping all external layers from said wafer;
   etching the surfaces of said wafer so as to effectively remove all P/N junctions;
   introducing a layer of dopant to form a P/N junction in a first of said wafer surfaces;
   forming a first conductive electrode over said layer of dopant; and
   forming a second conductive electrode on a second surface of said wafer opposed to said first surface, said solar cell being produced from the reject wafer without gettering to eliminate the process induced contaminants.

2. A process for manufacturing a solar cell from a reject semiconductor wafer as recited in claim 1 wherein the step of forming a first conductive electrode includes providing an external metal mask having a preselected pattern of slots therethrough;
   laying the mask in a covering relationship on said layer of dopant; and
   sputtering a first conductive material on said layer of dopant through said pattern.

3. A process for manufacturing a solar cell from a reject semiconductor wafer as recited in claim 2 wherein the substep of sputtering is followed by the step of sputtering a second conductive material on said first conductive material.

4. A process for manufacturing a solar cell from a reject semiconductor wafer as recited in claim 3 wherein said first conductive material is titanium and said second conductive material is silver.

5. A process for manufacturing a solar cell from a reject semiconductor wafer as recited in claim 4 wherein said titanium has a depth of about 1500 Anstroms and wherein said silver has a depth of about 50,000 Angstroms.

6. A process for manufacturing a solar cell from a reject semiconductor wafer as recited in claim 2 wherein the top surface of said layer is bombarded with ions prior to the step of sputtering to remove contaminants from said wafer.

7. A process for manufacturing a solar cell from a reject semiconductor wafer as recited in claim 1 wherein the step of etching includes immersing said wafer in an etchant having a constant etching rate, and agitating the etchant relative to said wafer so as to produce a nonpreferential removal of said surfaces.

8. A process for manufacturing a solar cell from a reject semiconductor wafer as recited in claim 1 wherein the step of introducing a layer of dopant includes heating said wafer, and forming a layer of boron over said surfaces.

9. A process for manufacturing a solar cell from a reject semiconductor wafer as recited in claim 8 wherein said boron is diffused into said wafer to a depth corresponding to a sheet resistivity of about 60 ± 30 ohms per square.

10. A process for manufacturing a solar cell from a reject semiconductor wafer as recited in claim 8 wherein the step of forming a layer of boron is followed by the steps of forming an etchant-resistant coating over at least a portion of said boron layer, etching the surfaces of said boron layer so as to effectively remove said boron layer from those surfaces not covered with said coating, and removing said coating from said boron layer.

11. A process for manufacturing a solar cell from a reject semiconductor wafer as recited in claim 1 wherein the step of introducing a layer of dopant includes bombarding said first surface with boron ions, followed by step of annealing said wafer so as to allow the boron to stabilize within said wafer.

12. A process for manufacturing a solar cell from a reject semiconductor wafer as described in claim 1 wherein said solar cell is made without polishing any surface of the reject semiconductor wafer.

13. A process for manufacturing a solar cell from a reject semiconductor wafer having one type conductivity and containing process induced contaminants in the silicon bulk latice, comprising:
   stripping all external layers from said wafer;
   etching the surfaces of said wafer so as to effectively remove the P/N junctions;
   forming a layer of material having an opposed type conductivity on a first of said wafer surfaces, said first surface providing a P/N junction;
   forming a first conductive electrode over said layer; and
   forming a second conductive electrode on a second surface of said wafer opposed to said first surface, said solar cell being produced from the reject wafer without gettering to eliminate the process induced contaminants 14. A process for manufacturing a solar cell from a reject semiconductor wafer as described in claim 13, wherein said solar cell is made without polishing any surface of the reject semiconductor wafer.

* * * * *